United States Patent
Lei et al.

(10) Patent No.: US 7,167,119 B1
(45) Date of Patent: Jan. 23, 2007

(54) DELTA-SIGMA MODULATORS WITH DOUBLE SAMPLING INPUT NETWORKS AND SYSTEMS USING THE SAME

(75) Inventors: Gong Tom Lei, Austin, TX (US); Thuan Luong Nguyen, Austin, TX (US); Daniel John Allen, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/312,882

(22) Filed: Dec. 20, 2005

(51) Int. Cl.
*H03M 3/00* (2006.01)
(52) U.S. Cl. .................. 341/143; 341/150; 341/172
(58) Field of Classification Search ................ 341/143, 341/150, 172
See application file for complete search history.

(56) References Cited

U.S. PATENT DOCUMENTS

| | | | | |
|---|---|---|---|---|
| 5,039,989 A | * | 8/1991 | Welland et al. | 341/143 |
| 5,057,839 A | * | 10/1991 | Koch | 341/143 |
| 5,323,158 A | * | 6/1994 | Ferguson, Jr. | 341/143 |
| 5,477,481 A | * | 12/1995 | Kerth | 708/819 |
| 6,384,761 B1 | | 5/2002 | Melanson | |
| 6,653,967 B1 | * | 11/2003 | Hamashita | 341/172 |
| 6,670,902 B1 | * | 12/2003 | Melanson et al. | 341/143 |
| 6,972,705 B1 | * | 12/2005 | Fei et al. | 341/143 |
| 2004/0201511 A1 | * | 10/2004 | Liu et al. | 341/172 |

OTHER PUBLICATIONS

Yang et al., "A 114dB 68 W Chopper Stabilized Stereo Multibit ADC in 5.62sq mm", IEEE J. SSC vol. 38, No. 12, Dec. 2003, 8 pages.
Prasad et al., "A 120dB 300 mW Stereo Audio A/D Converter With 110dB THD+N", Proceedings of ESSCIRCE, 2004, 5 pages, no month.
Fujimori et al., A 5v Single-chip Delta-Sigma Audio A/D Converter With 111dB Dynamic Range, IEEE J. SSC vol. 32, Mar. 1997, 8 pages.
Rabii et al., "A 1.8v Digital-Audio Sigma-Delta Modulator in 0.8mm CMOS", IEEE J. SSC vol. 32, Jun. 1997, 14 pages.

* cited by examiner

*Primary Examiner*—Rexford Barnie
*Assistant Examiner*—Khai M. Nguyen
(74) *Attorney, Agent, or Firm*—James J. Murphy; Thompson & Knight, LLP

(57) ABSTRACT

A method of sampling an input signal in a delta-sigma modulator having at least an integrator stage and a feedback digital-to-analog converter (DAC) stage includes sampling an input signal at a sampling rate by alternately utilizing the two sampling capacitors during two sampling cycles such that the two sampling capacitors are each being utilized at half the rate of the sampling rate. Samples from the two sampling capacitors are summed at the sampling rate at an intermediate node with a feedback samples provided by the feedback DAC stage at the sampling rate to generate output samples which are output from integrator stage at the sampling rate.

17 Claims, 5 Drawing Sheets

US 7,167,119 B1

DELTA-SIGMA MODULATORS WITH DOUBLE SAMPLING INPUT NETWORKS AND SYSTEMS USING THE SAME

FIELD OF INVENTION

The present invention relates in general to mixed-signal circuit techniques, and in particular, to delta-sigma modulators with double sampling input networks and systems using the same.

BACKGROUND OF INVENTION

Delta-sigma modulators are particularly useful in digital to analog and analog to digital converters (DACs and ADCs). Using oversampling, a delta-sigma modulator spreads the quantization noise power across an oversampling frequency band, which is typically much greater than the input signal bandwidth. Additionally, the delta-sigma modulator performs noise shaping by acting as a lowpass filter to the input signal and a highpass filter to the noise; hence, most of the quantization noise power is thereby shifted out of the signal band.

The typical delta-sigma modulator includes a summer summing the input signal with negative feedback, a linear filter, quantizer and a feedback loop with a digital to analog converter coupling the quantizer output and the inverting input of the summer. In a first order modulator, the linear filter comprises a single integrator stage while the filter in a higher order modulator comprises a cascade of a corresponding number of integrator stages. The quantizer can be either a one-bit or a multiple-bit quantizer. Higher-order modulators have improved quantization noise transfer characteristics over those of lower order, but stability becomes a more critical design factor as the order increases.

Switched-capacitor filters/integrators are useful in a number of applications including the integrator stages in delta-sigma modulators. Generally, a basic differential switched-capacitor integrator samples the input signal, and often a reference voltage as well, onto a corresponding pair of sampling capacitors during the sampling (charging) phase. During the following charge transfer phase, the charge on the sampling capacitor is transferred at the summing nodes of an operational amplifier to a corresponding pair of integrator capacitors in the amplifier feedback loops. The operational amplifier drives the integrator output.

Noise performance is an important design constraint in delta-sigma modulator design. Noise can result from a number of different factors, including parasitic capacitances and timing mismatches. Settling time is another constraint on noise performance when switched-capacitor integrator stages are utilized. Generally, sufficient time must be provided during the charge transfer phases to allow the voltages at the opamp inputs to settle to their steady state values. This time requirement in turn limits the switching speed of the integrator stage, and consequently the operating speed of the overall system, or alternatively limits noise performance.

Reducing input impedance of a switched capacitor integrator stage is a further important design consideration. A higher input impedance will allow the integrator stage to be driven by a smaller, less complicated, and/or less expensive driver circuit.

Hence, for applications requiring low-noise delta-sigma modulation, improved techniques for reducing noise are required. Another goal is the reduction of the input impedance at the input sampling network, such that smaller, less complicated, external drivers may be utilized. Finally, improvement of modulator performance at high frequencies is an additional design consideration, which should be addressed.

SUMMARY OF INVENTION

In one representative embodiment of the principles of the present invention, a method is disclosed for sampling an input signal in a delta-sigma modulator having at least an integrator stage and a feedback digital-to-analog converter (DAC) stage and which includes sampling an input signal at a sampling rate by alternately utilizing two sampling capacitors during two sampling cycles such that the two sampling capacitors are utilized at half of the sampling rate. Samples from the two sampling capacitors are summed at the sampling rate at an intermediate node with feedback samples provided by the feedback DAC stage at the sampling rate to generate output samples which are output from integrator stage at the sampling rate.

In sum, by alternatively switching each input between each sampling capacitor at half the modulator feedback loop rate, the impedance of the sampling network/integrator stage is approximately doubled. In turn, the external driver circuitry driving the stage may be made smaller and less expensive. Additionally, by alternating each input between sampling capacitors during odd and even cycles, the sampling capacitors must only be charged proportional to the relatively small change in the input voltage, rather than charged proportional to the full input voltage swing. Consequently, each sampling phase of each cycle may be shortened, and each charge transfer phase lengthened, such that power consumption and size of the first integrator stage in the cascade are reduced. Additionally, with the sampling capacitors being charged with a reduced voltage swing, noise and distortion are reduced. Finally, in a multiple stage delta-sigma modulator, decreasing the size and power of the first stage in the cascade allows for a proportional reduction in the size and power of the following stages.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts.

Figure 1:
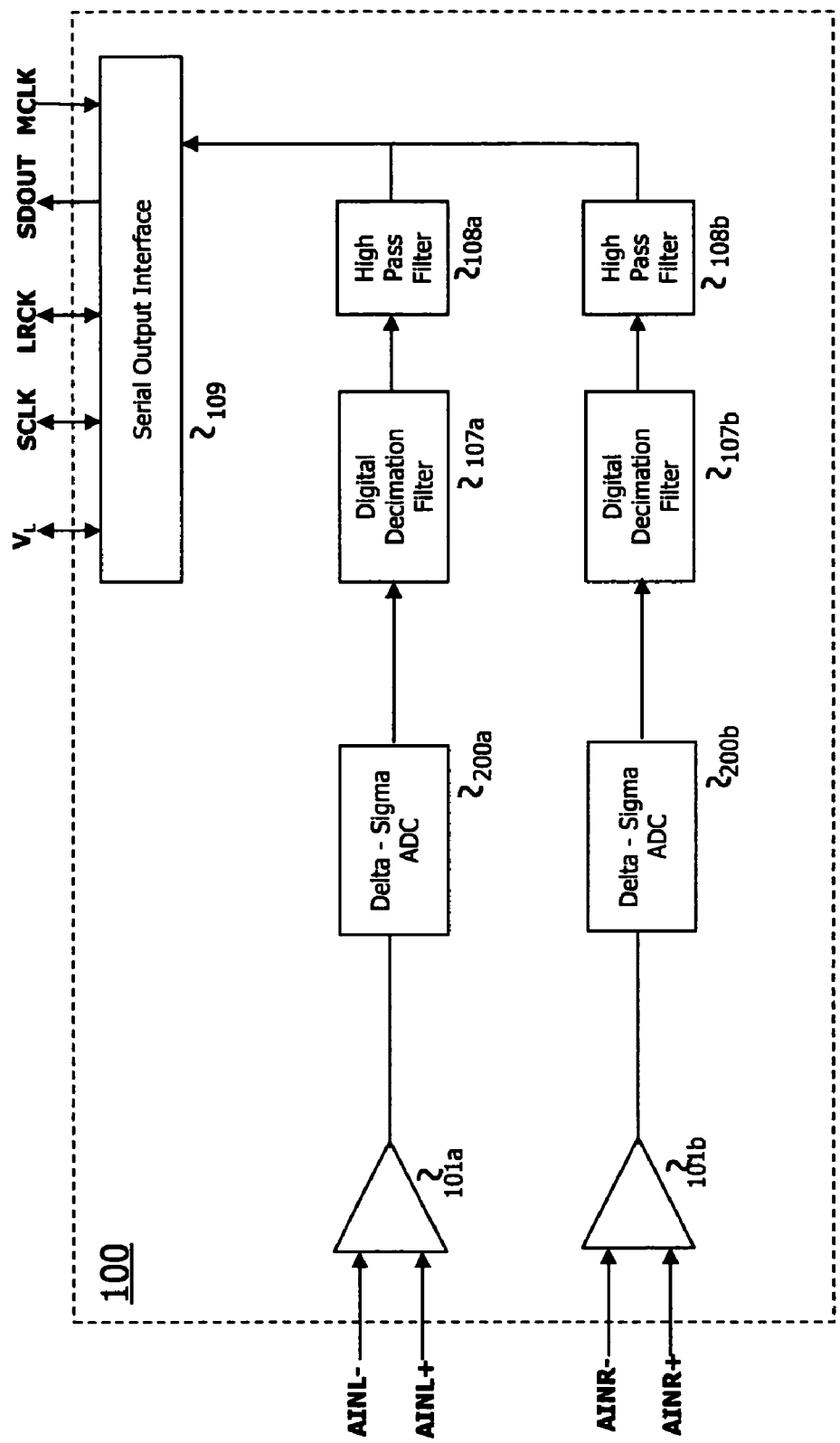
FIG. 1 is a high level operational block diagram of an analog to digital converter suitable for illustrating the application of the inventive principles.

FIG. 1 is a high-level operational block diagram of a single-chip audio analog-to-digital (A/D) 100 suitable for practicing the principles of the present invention. A/D converter 100 is only one of a number of possible applications employing delta-sigma data converters. Other examples include digital to analog converters (DACs) and Codecs.

A/D converter 100 includes two conversion paths for converting left and right channel analog audio data respectively received at left and right analog differential inputs AINL+/− and AINR+/−. The analog input signals are respectively passed through input gain stages 101a–101b and then to delta-sigma analog to digital converters (ADCs) 200a–200b, which will be described in detail in conjunction with FIG. 2. The digital outputs of delta-sigma ADCs 200a–200b are passed through corresponding decimation filters 107a–107b, which reduces the sample rate, and high pass filters 108a–108b. Delta-sigma ADCs 200a–200b sample the analog-signal at the oversampling rate and output digital data, in either single-bit or multiple-bit form depending on the quantization, at the oversampling rate. The resulting quantization noise is shaped and generally shifted to frequencies above the audio band.

The resulting left and right channel digital audio data are output through a single serial port SDOUT of serial output interface 109, timed with serial clock SCLK and left-right clock LRCK in accordance with the Digital Interface Format (DIF). The SCLK and LRCK clocks can be generated externally and input to converter 100 or can be generated on-chip, along with the associated data, in response to a received master clock MCLK.

Figure 2:
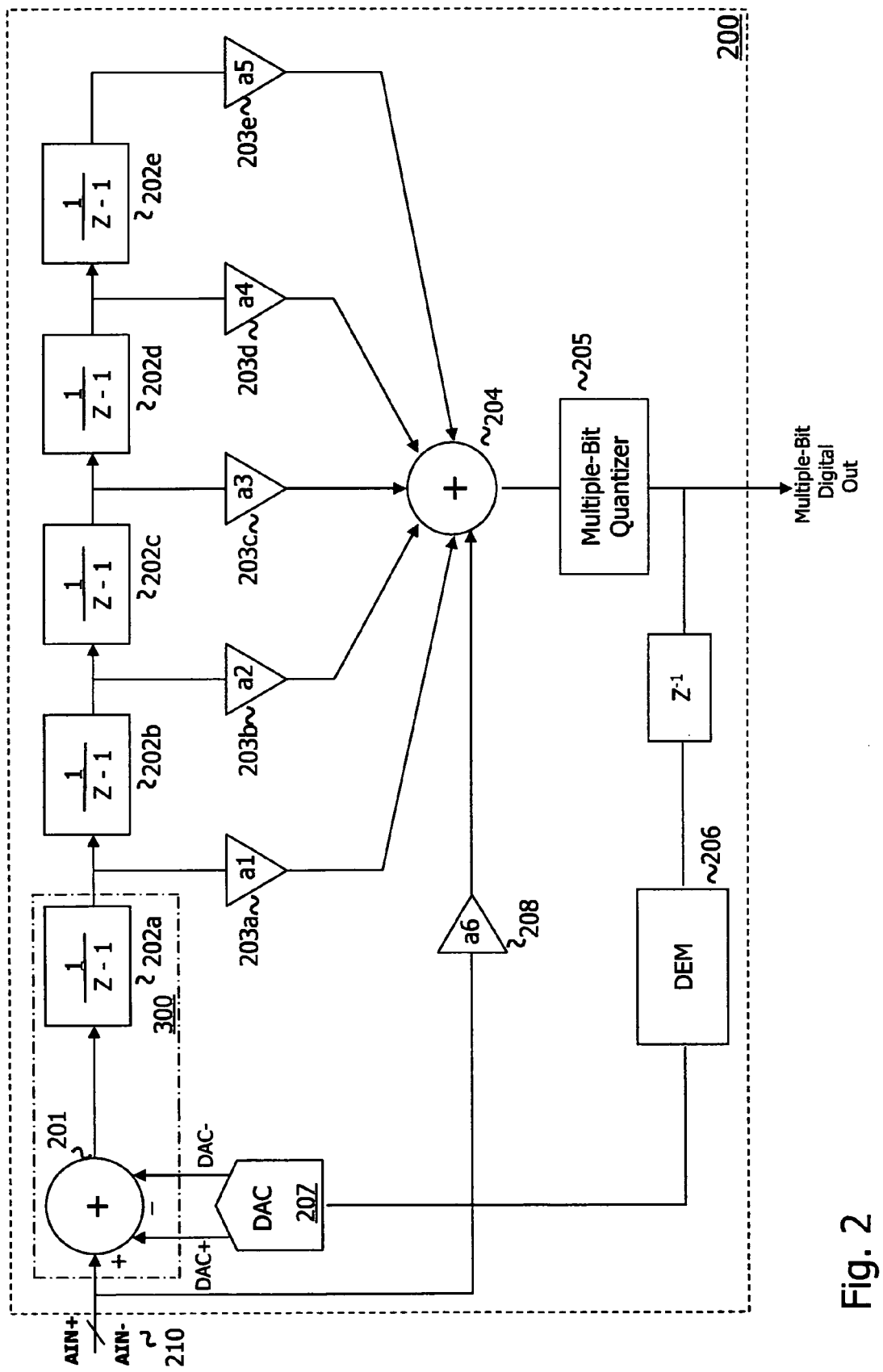
FIG. 2 is a operational block diagram of an exemplary 5th order delta-sigma modulator suitable for use in circuits and systems such as the analog to digital converter shown in FIG. 1.

FIG. 2 is an exemplary 5th order feedforward delta-sigma modulator 200, which is a suitable modulator that can be used in delta-sigma ADC 200a or 200b. Delta-sigma modulator 200 comprises an input summer 201 and five (5) integrator stages 202a–202e. Delta-sigma modulator 200 is a weighted feed-forward design in which the outputs of each of the integrator stages are passed through a gain stage (amplifier) 203a–203e to an output summer 204. Amplifiers 203a–203e allow the outputs of the integrator stages to be weighted at the input of summer 204. The output from summer 204 is quantized by a multiple-bit quantizer 205, which generates the multiple-bit digital output signal. Additionally, the output from quantizer 205 is fed back to the inverting input of summer 201 through dynamic element matching (DEM) circuitry 206 and multiple-bit digital to analog converter (DAC) 207. (A 5th order feed-forward design was selected for discussion purposes; in actual implementation; the order as well as the configuration of the modulator will vary. A general discussion of delta-sigma modulator topologies can be found in the literature, for example, in Norsworthy et al., *Delta-Sigma Data Converters, Theory, Design and Simulation*, IEEE Press, 1996).

FIG. 2 also shows an additional feed-forward path, including amplifier 208, between modulator input 210 and summer 204. The gain of amplifier stage 208 is preferably:

Gain=(1/Quantizer gain)*(1/Multi-Bit DAC gain)

The purpose of this additional feed-forward path is to cancel as much of the input signal energy from the delta-sigma loop as possible. Consequently, most of the voltage swing within the modulator will be quantization noise. In turn, the design constraints on the sub-circuits within modulator 200 can be relaxed. For example, the first integrator stage 202a is typically the major contributor to the noise performance of the entire modulator. This feed-forward technique results in less signal energy at the outputs of the integrator stages and hence such parameters as the stage opamp DC gain can be reduced. In turn, the power consumption of the device as well as the die size can be reduced.

Figure 3A:
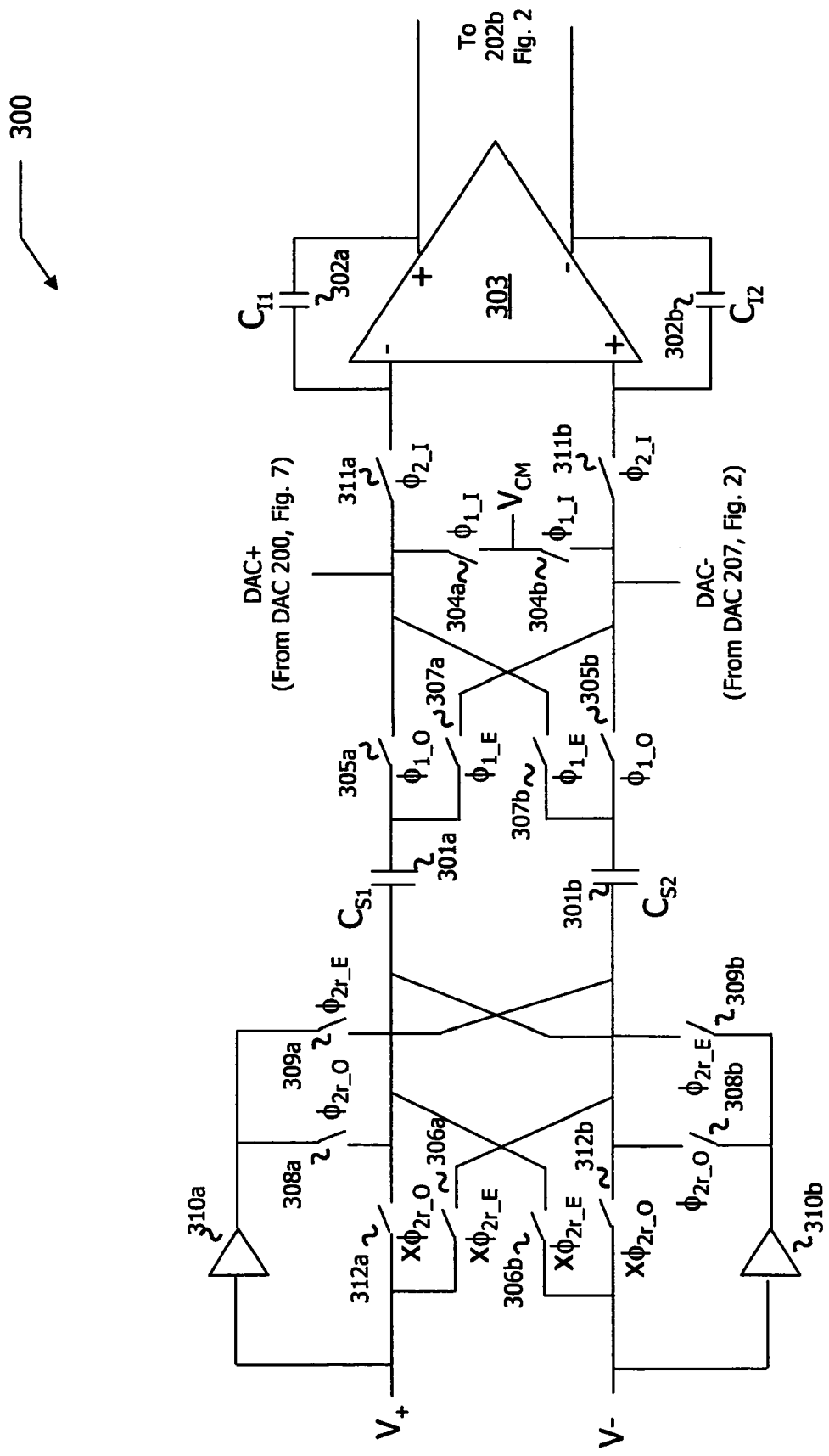
FIG. 3A is a more detailed operational block diagram of a switched-capacitor sampling/input integrator stage of the delta-sigma modulator shown in FIG. 2.

FIG. 3A is an electrical schematic diagram of a double sampling input sampling network/integrator 300 embodying the principles of the present invention. In one representative application, input sampling network/integrator 300 is advantageously utilized as input summer 201 and first stage 202a of delta-sigma modulator 200 of FIG. 2, although its utility is not limited thereto.

Input sampling network/integrator 300 of FIG. 3A generally operates in odd and even cycles, with each cycle including a charge sampling phase $\phi_1$ and a charge transfer phase $\phi_2$. The odd and even cycles are performed at a rate which is at one-half (½) of the loop rate of delta-sigma modulator 200, as defined by the MCLK signal. The sampling rate $f_S$ for discussion purposes is defined as the rate at which samples are streamed through integrator stages 202a–202e, amplifiers 203a–203e, summer 204, multiple bit quantizer 205, and DEM 206. In the illustrated embodiment, the odd and even operating cycles of integrator stage 300 are performed at a rate of approximately half the sampling rate $f_S$.

Generally, during sampling phase $\phi_1$ of each odd cycle, charges proportional to the voltages AINL− and AINL+ at the inputs to input sampling network/integrator 300 are respectively sampled onto cross-coupled sampling capacitors 301a and 301b. During the charge transfer phase $\phi_2$ of each odd cycle, the input voltages AIN+ and AINL− are coupled to the input plates of sampling capacitors 301a and 301b, such that the input plate to sampling capacitor 301a is coupled to the positive input AINL+ and the input plate to sampling capacitor 301b is coupled to the negative input AIN−. Consequently the charges sampled onto sampling capacitors 301a and 301b are respectively forced onto integration capacitors 302a and 302b.

During the sampling phase $\phi_1$ of the immediately following even cycle, the inputs AIN+ and AINL− remain coupled to sampling capacitors 301a and 301b, respectively, such that a charge proportional to the voltage at the positive input AIN+ is sampled on to sampling capacitor 301a and charge proportional to the voltage at the negative input AINL− is sampled onto capacitor 301b. During the charge transfer phase of each even cycle, the output plates of sampling capacitors 301a–301b are cross-coupled such that the charge on sampling capacitors 301a is transferred to integration capacitor 302b and the charge on sampling capacitor 301b is transferred to integration capacitor 302a. After the completion of the current even cycle, the next odd cycle is performed, as previously discussed. In the illustrated embodiment, a given sampling capacitor 301a or 301b is sampled from a given input AINL+ and AINL− every four (4) periods of the MCLK signal.

At the same time, charges from the outputs DAC+ and DAC− of DAC 207 of FIG. 2 are transferred respectively to the summing nodes of opamp 303 during every odd and even cycle. The resulting summed charges at the summing nodes of opamp 303 are then output from sampling/integrator stage 303 at the full modulator loop rate.

Advantageously, by performing the odd and even cycles at half the sampling rate $f_S$, the input impedance into integrator stage 300 approximately doubles. Additionally, by alternately sampling charge onto sampling capacitors 301a and 301b from the inputs AIN+ and AINL−, the amount of charge which must be sampled onto each sampling capacitor 301a and 301b during a given odd or even phase is limited to the charge proportional to the change in voltage at the inputs AIN+ and AINL− between sampling phases, along with a small switching glitch. At high sampling frequencies, this difference in voltages is small. As a result, the time of each sampling phase $\phi_1$ of each odd or even cycle may be shortened and the corresponding charge transfer phase $\phi_2$ of each odd or even cycle may be lengthened. Advantageously, longer charge transfer phases $\phi_2$ allow the transistors involved in the charge transfer operations to be smaller thereby reducing overall die area and power consumption. Furthermore, the smaller voltage differences sampled during sampling phases $\phi_1$ reduce the charge kick on the buffers controlling the common mode voltage $V_{CM}$.

Figure 3B:
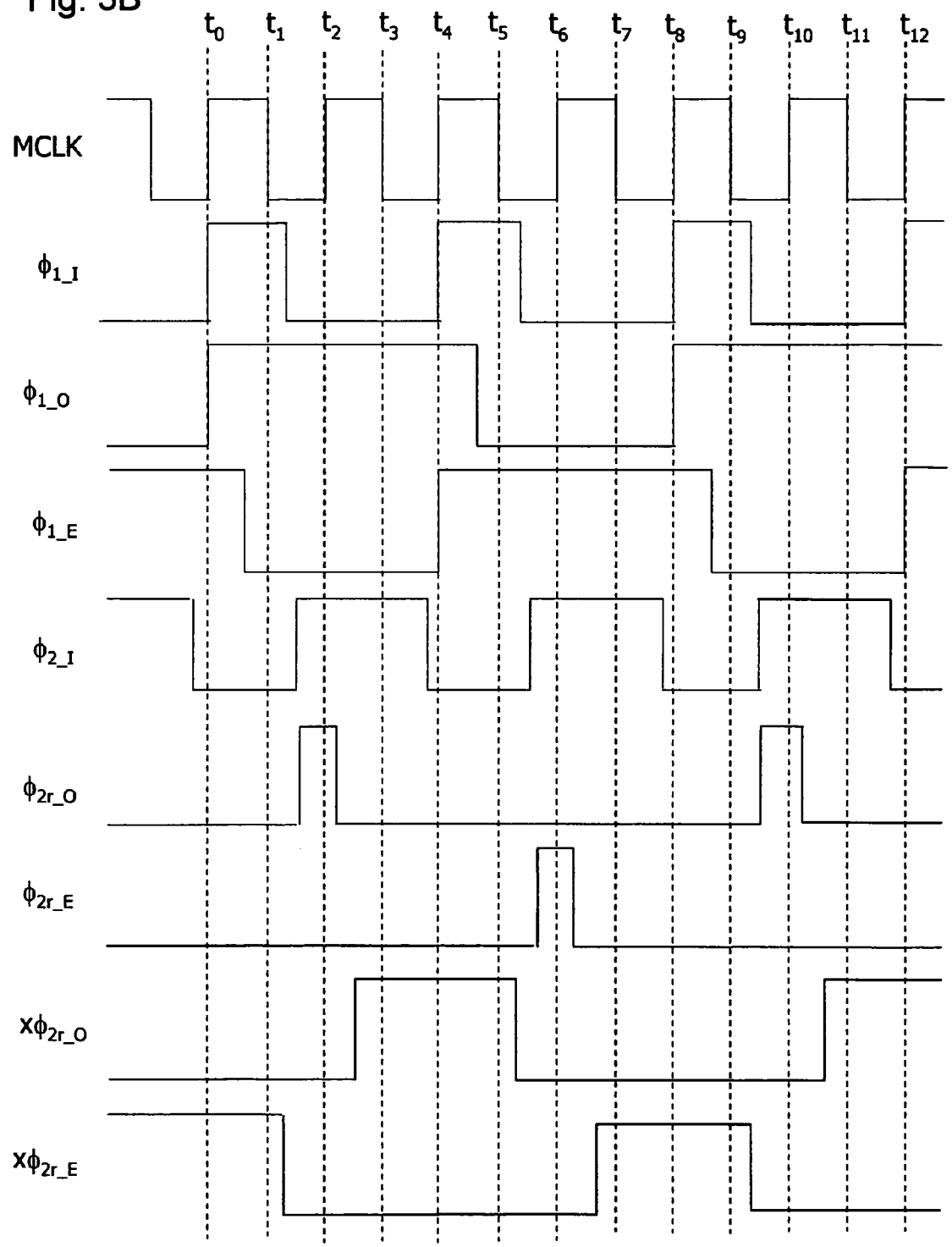
FIG. 3B is a conceptual timing diagram illustrating exemplary operations of the switched-capacitor stage shown in FIG. 3A according to the principles of the present invention.

The specific operation of exemplary input sampling network/integrator 300 can now be described in reference to the timing diagram of FIG. 3B. In FIG. 3B, the index "I" stands for signals related to operations of integrator stage 300, the indices "E" and "O" correspond respectively for even and odd cycles, and the indices "R" and "F" correspond respectively to rough and fine subphases. Thus, for example, the signal $\phi_{2r\_E}$ controls the rough subphase of charge transfer phase ($\phi_2$) for an even cycle.

At the rising edge of the MCLK signal at time $t_0$, the control signal $\phi_{1\_I}$ closes switches 304a and 304b. At the same time, for the odd cycle, the control signal $\phi_{1\_O}$ closes switches 305a and 305b such that the output plates of sampling capacitors 301a and 301b are connected to the common mode voltage $V_{CM}$. During a short overlap period between time $t_0$ and $t_1$ the control signal $\phi_{1\_E}$ is also active, such that switches 307a and 307b also close. With switches 304a–304b, 305a–305b, and 307a–307b all closed during the overlap period, the time required to settle the output plates of capacitors 301a and 301b is advantageously shortened.

The control signal $x\phi_{2r\_E}$, which is active at time $t_0$, closes switches 306a and 306b such that capacitor 301a charges from input AINL− and capacitor 301b charges from the AIN+ input. During sampling phase $\phi_{1\_O}$ the control signals $\phi_{2r\_O}$ and $\phi_{2r\_E}$ are inactive, such that switches 308a–308b and 309a and 309b are open. Shortly after time $t_1$, the control signals $\phi_{1\_I}$ and $x\phi_{2r\_E}$ transition to an inactive (low) state.

At time $t_2$, at the next rising edge of the MCLK signal, the control signals $\phi_{1\_O}$, $\phi_{2r\_O}$, and $\phi_{2\_I}$ are active, such that sampling capacitors 301a and 301b are respectively coupled to integration capacitors 302a and 302b through switches 305a and 305b. The control signal $\phi_{1\_I}$ is inactive such that switches 304a and 304b open. The rough charge transfer period of charge transfer phase $\phi_2$ for the odd cycle, begins with the activation of the control signal $\phi_{2r\_O}$, which closes switches 308a and 308b. Rough buffer 310a then charges the input plate to sampling capacitor 301a from the AIN+ input to start forcing charge on sampling capacitor 301a onto integration capacitor 302a. Similarly, rough buffer 310b charges the input plate of sampling capacitor 301b from the AINL− input to start forcing charge from a sampling capacitor 301b onto integration capacitor 302b.

Shortly after time $t_2$, the control signal $\phi_{2r\_O}$ transitions to an inactive state and the control signal $x\phi_{2r\_O}$ transitions to an active high state, such that switches 308a and 308b open and switches 312a and 312b close to start the fine charge period of the transfer phase. During the fine charge transfer phase, the input plates of sampling capacitors 301a and 301b are directly charged from the AIN+ and AINL− inputs, respectively, through switches 312a and 312b, under the control of the $x\phi_{2r\_O}$ signal.

While the control signal is $\phi_{2\_D}$ active, during both the odd and even transfer phases, the charge from DAC 200 outputs DAC+ and DAC− from FIG. 2 are transferred to integration capacitors 302a and 302b, as discussed further below.

The even cycle begins at time $t_4$, when the signals $\phi_1$ and $\phi_{1\_E}$ are in an active state thereby closing switches 304a–304b and 307a–307b such that the output plates of sampling capacitors 301a and 301b are brought to the common mode voltage $V_{CM}$. During a short overlap period at the start of the even cycle, between time $t_3$ and time $t_4$, the signal $\phi_{1\_O}$ remains active and switches 305a and 305b remain closed to improve the settling time of the voltage at the output plates of sampling capacitors 301a and 301b.

The signal $x\phi_{2\_O}$ is active at time $t_4$, such that switches 312a and 312b remain closed such that sampling capacitor 301a charges from the AIN+ input and sampling capacitor 301b charges from the AINL− input. Advantageously, the only charging which is required at the input plates of sampling capacitors 301a and 301b is the difference between the charge remaining on sampling capacitors 301a and 301b at time $t_3$, at the end of the preceding odd cycle, and a charge proportional to the voltages at the inputs AIN+ and AINL− at time $t_4$. Additionally, the amount of charge being sampled onto sampling capacitors 301a and 301b may include charge required to compensate for switching glitches caused by the capacitances of the various switches in input sampling network/integrator 300. Between time $t_5$ and time $t_6$, the sampling phase of the even cycle completes. In particular, the signals $\phi_{2r\_O}$ and $\phi_{1\_I}$ transition to an inactive state such that switches 304a–304b and 312a–312b open.

The charge transfer phase of the even cycle begins shortly before time $t_6$ with the rough transfer of charge from sampling capacitor 301a to cross-coupled integration capacitor 302b through switch 307a and from sampling capacitor 301b through switch 307b to cross-coupled integration capacitor 302a. Specifically, during the rough portion of the charge transfer phase $\phi_2$ of the even cycle, the signals $\phi_{2\_I}$ and $\phi_{2r\_E}$, are both in an active state and the control signal $x\phi_{2r\_E}$ is in an inactive state. Thus, the input plate of sampling capacitor 301a charges from the AIN+ input through switch 309a and rough buffer 310a to force charge onto cross-coupled integration capacitor 302b. Similarly, the input plate of sampling capacitor 301b charges from the AINL− input through rough buffer 310b to force the charge sampled onto sampling capacitor 301a during the sampling phase of the even cycle onto cross coupled integration capacitor 302a.

During the fine portion of the charge transfer phase of the even cycle, at time $t_7$, the control signal $\phi_{2\_E}$ becomes inactive and the control signal $X\phi_{2r\_E}$ becomes active, such that the input plate of capacitor 301a charges directly from the AINL− input through switch 306b and the input plate of sampling capacitor 301b charges directly from the AIN+ input through switch 306a, to complete the charge transfer from sampling capacitors 301a and 301b to cross-coupled integration capacitors 302b and 302a.

The odd and even cycles repeat in a similar fashion while integrator 300 is operating. For example, the next odd cycle begins at time $t_8$. Hence, in the illustrated embodiment, each odd and each cycle is approximately two (2) periods of the MCLK signal long, although a given sampling capacitor 301a or 301b is only charged from a given input AIN+ or AIN− approximately every four (4) periods of the MCLK signal. At the same time, charge is transferred from DAC 207 outputs DAC+ and DAC— of FIG. 2 to the intermediate nodes at the inputs to switches 311*a* and 311*b*, every two (2) periods of the MCLK signal, generally as follows.

Figure 4:
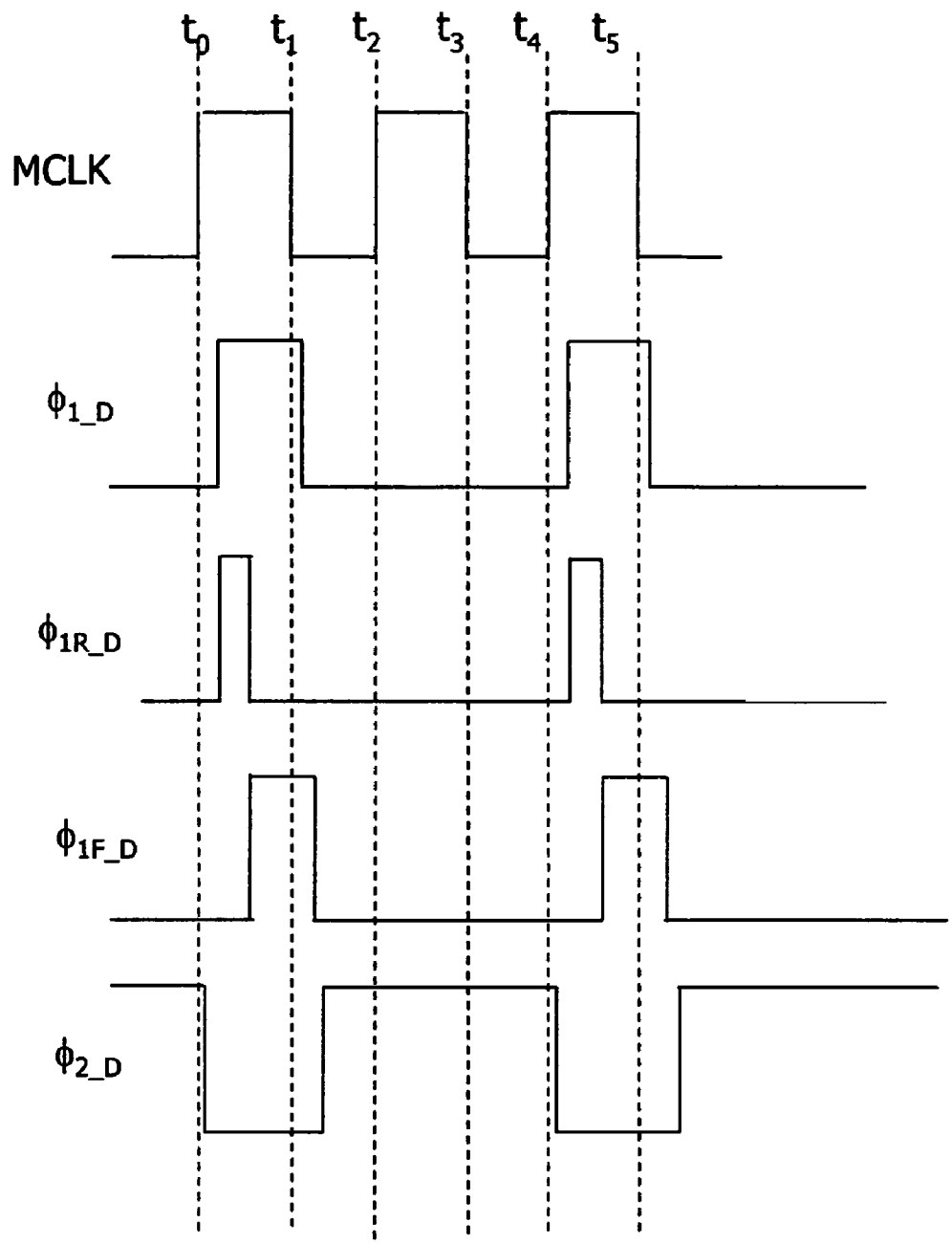
FIG. 4 is a conceptual timing diagram illustrating exemplary operations of the feedback loop digital to analog converter (DAC) of the delta-sigma modulator shown in FIG. 2.

FIG. 4 is a timing diagram illustrating the transfer of charge from DAC 207 outputs DAC+ and DAC−. In FIG. 4, the index "D" stands for signals related to operations of DAC 207 and the indices "R" and "F" correspond respectively to rough and fine subphases. Thus, for example, the signal $\phi_{1R\_D}$ controls the rough subphase of each sampling phase ($\phi_1$).

Generally, charge is transfer at the full modulator feedback loop rate. In the illustrated embodiment, charge is provided from DAC outputs DAC+ and DAC− every two periods of the MCLK signal. Each cycle of DAC 207 includes a sampling phase $\phi_1$, having both rough and fine subphases, and a charge transfer phase $\phi_2$. The depicted times $t_0$–$t_5$ generally correspond to times $t_0$–$t_5$ shown in FIG. 3B.

A representative sample/charge transfer cycle within DAC 207 begins at time $t_0$, with the rising edge of the $\phi_{1\_D}$ signal. The rough subsampling phase is then triggered by the $\phi_{1R\_D}$ signal, and is followed by the fine subsampling phase, which is controlled by the $\phi_{1F\_D}$ signal. Slightly after time $t_1$, the signals $\phi_{1\_D}$ and $\phi_{1R\_D}$ transition to an inactive state and the charge transfer phase begins with the rising edge of the signal $\phi_{2\_D}$, and charge begins to be transferred to the outputs DAC+ and DAC The charge transfer phase continues through times $t_2$–$t_3$ and at time $t_4$, the next charge sampling phase begins.

Hence, input sampling network/integrator 300 realizes a number of significant advantages over the prior art. For example, since input sampling network/integrator 300 samples the voltages at each input AIN+ or AINL− to a given sampling capacitor 306*a* or 306*b* at approximately half the sampling rate of the delta-sigma modulator 200 loop, the input impedance to input sampling network/integrator 300 approximately doubles. Additionally, since the sampling capacitors must only be charged with a charge proportional to the change in the input voltages between the odd and even cycles, the sampling phases ($\phi_1$) of each cycle may be shortened. In turn, the charge transfer phase of each cycle may be increased such that the size of the switching transistors may be reduced, for all stages 202*a*–202*e* of FIG. 2, thereby saving die area and reducing power consumption. Additionally, the overlap between the odd and even cycles allows the output plates of the sampling capacitors to more rapidly settle to the common mode voltage prior to sampling to be driven by a smaller, less complicated, and/or less expensive driver circuit.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An input network for a delta-sigma modulator having at least an integrator stage and a feedback digital-to-analog converter (DAC) stage, comprising:
   an input sampling and transfer circuit having input sampling switches coupled to two sampling capacitors and output sampling switches coupled to the two sampling capacitors, wherein the input sampling and transfer circuit:
      samples an input signal at a sampling rate, alternately utilizing the two sampling capacitors during two sampling cycles such that the two sampling capacitors are each being utilized at half the rate of the sampling rate; and
      charge transfers the samples at the sampling rate for the integrator stage; and
   a feedback digital-to-analog converter (DAC) circuit coupled to switch outputs of the output sampling switches for providing at the switch outputs a feedback DAC signal at the sampling rate and independently of the half rate, the integrator stage providing from the switch outputs of the output sampling switches an output signal at the sampling rate.

2. The input network of claim 1, wherein the input signal comprises one of a pair of differential input signals.

3. The input network of claim 1, wherein the input switches are operable at half the loop rate to charge the two capacitors from two corresponding voltages during a sampling phase and cross-couple the two sampling capacitors with the two voltages during a charge transfer phase to transfer charge to two nodes capacitors through the output switches.

4. The input network of claim 3, wherein the output switches are operable to alternately couple at half the loop rate the two sampling capacitors and the two nodes.

5. The input network of claim 3, wherein each cycle includes a charging phase and a charge transfer phase, and the output switches are further operable during a first portion of the charging phase to couple together output plates of the two capacitors to improve settling to a common mode voltage.

6. The input network of claim 1, wherein the delta-sigma modulator has a feed-forward topology.

7. The input network of claim 1, wherein charge transfers are performed with a rough charge transfer phase and a fine charge transfer phase.

8. A method of sampling an input signal in a delta-sigma modulator having at least an integrator stage and a feedback digital-to-analog converter (DAC) stage, comprising:
   sampling an input signal at a sampling rate by alternately utilizing two sampling capacitors during two sampling cycles such that the two sampling capacitors are utilized at half of the sampling rate;
   alternately transferring samples from each of the two sampling capacitors at half the sampling rate to an intermediate node for summation with feedback samples provided by the feedback DAC stage at the sampling rate; and
   outputting samples summed at the intermediate node from the integrator stage at the sampling rate from the integrator stage.

9. The method of claim 8, wherein sampling comprises:
   charging the two capacitors at half the loop rate from two corresponding voltages during a sampling phase and cross-coupling the two sampling capacitors with the two voltages during a charge transfer phase to transfer charge to the intermediate node.

10. The method of claim 9, wherein transferring comprises:

alternately coupling at half the loop rate each of the two sampling capacitors with the intermediate node.

11. The method of claim 9, wherein the input signal comprises one of a pair of differential input signals.

12. The method of claim 8, wherein the delta-sigma modulator has a feed-forward topology.

13. The method of claim 8, wherein during a portion of a sampling period output plates of the two capacitors are coupled together to improve settling to a common mode voltage.

14. A method of operating a delta-sigma modulator comprising at least one filter stage, a quantizer, and a feedback loop providing complementary feedback signals, comprising:

during alternating cycles performed at half the loop rate, charging first and second capacitors respectively from first and second inputs during a sampling phase and cross-coupling the first and second capacitors respectively with the second and first inputs during a charge transfer phase to transfer charge respectively from the first and second capacitors to first and second intermediate nodes;

during other alternating cycles performed at half the loop rate, charging the first and second capacitors respectively from the second and first inputs during a sampling phase and cross-coupling the first and second capacitors respectively with the first and second inputs during a charge transfer phase to transfer charge respectively from the second and first capacitors to the first and second intermediate nodes; and transferring to operational amplifier summing nodes at the loop rate the charge at the first and second intermediate nodes along with the complementary feedback signals received at the intermediate nodes directly from the feedback loop at the loop rate.

15. The method of claim 14, further comprising during a first portion of the sampling phase of a selected cycle coupling output plates of the first and second capacitors together and to a common mode voltage.

16. The method of claim 14, wherein the delta-sigma modulator comprises an analog delta-sigma modulator and the method further comprises generating the complementary feedback signals with digital to analog converter coupling an output of the quantizer and complementary inputs to the delta-sigma modulator.

17. The method of claim 14, wherein each charge transfer phase of each odd and even cycle comprises a rough charge transfer subphase and a fine charge transfer subphase.

\* \* \* \* \*